(12) United States Patent
Graham et al.

(10) Patent No.: US 6,678,575 B1
(45) Date of Patent: Jan. 13, 2004

(54) METHOD AND SYSTEM FOR GENERATING NUMERICALLY CONTROLLED TOOL PATHS ON A SOLID MODEL

(75) Inventors: Michael Graham, Slingerlands, NY (US); Nathan Smith, Latham, NY (US); John Jackson, Wyoming, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/065,052

(22) Filed: Sep. 13, 2002

(51) Int. Cl.⁷ .............................. G06F 7/00; G06F 19/00
(52) U.S. Cl. ................. 700/186; 700/182; 700/187; 700/189
(58) Field of Search ............................. 700/180, 182, 700/184, 186, 187, 189, 90, 108, 159, 56, 58, 66

(56) References Cited

U.S. PATENT DOCUMENTS

| | | | | |
|---|---|---|---|---|
| 4,825,377 A | * | 4/1989 | Seki et al. | ................ 700/187 |
| 4,866,631 A | * | 9/1989 | Kuragano et al. | .......... 700/187 |
| 5,369,592 A | * | 11/1994 | Honda | ........................ 700/187 |
| 5,659,478 A | | 8/1997 | Pennisi et al. | ......... 364/468.01 |
| 5,710,709 A | | 1/1998 | Oliver et al. | .......... 364/474.26 |
| 6,112,133 A | | 8/2000 | Fishman | ....................... 700/182 |
| 6,291,959 B1 | | 9/2001 | Yoshida et al. | ............. 318/569 |
| 6,363,298 B1 | | 3/2002 | Shin et al. | .................. 700/160 |

FOREIGN PATENT DOCUMENTS

EP 0 763 417 A1 3/1997

* cited by examiner

Primary Examiner—Jayprakash N. Gandhi
(74) Attorney, Agent, or Firm—Cantor Colburn LLP

(57) ABSTRACT

A method for defining a numerically controlled (NC) tool path on a identified region of a solid computer model is disclosed. In an exemplary embodiment, the method includes identifying boundary points so as to bound the identified region. The boundary points are processed so as to generate a plurality of bounding curves, wherein the bounding curves are generated so as to conform to a surface of the identified region. The NC tool path is then generated in a manner conforming to the bounding curves.

22 Claims, 11 Drawing Sheets

METHOD AND SYSTEM FOR GENERATING NUMERICALLY CONTROLLED TOOL PATHS ON A SOLID MODEL

BACKGROUND OF INVENTION

The present disclosure relates generally to numerically controlled (NC) manufacturing and, more particularly, to a method and system for generating NC tool paths on a solid model.

Numerically controlled (NC) machining and inspection of parts is a commonly used process that is well known to many types of manufacturing and repair operations. Under normal manufacturing conditions, the NC tool path taken by an NC cutting tool and/or inspection transducer is usually pre-defined and implemented multiple times on a large number of similar parts. For example, in operations that have sculptured surface conditions, the NC tool path is usually generated from computerized part models. However, in applications requiring the NC processing of only a small region of an in-process part having a small lot size for example, the normal benefits of automated NC control may not be realized. This is because a relatively large amount of time is required to generate an NC program from a computerized part model, thus making the endeavor unprofitable.

One approach used by part programmers to simplify and speed up the process of NC program generation involves "teaching" the NC tool paths to an NC system. Using this approach, part programmers generate the NC tool paths via a tedious, trial and error process of manually teaching the NC tool paths to an NC system by using the machine tools' positioning system. To accomplish this, a part programmer may use a joystick or other machine axis controls to drive the position of the NC tool or inspection transducer along a close approximation of the desired NC tool path. For complex regions, such as regions bounded by and/or encompassing a large number of part features where computer models are usually used to generate the NC tool paths, part programmers commonly cover a feature and/or model surface with NC tool paths and then manually edit these NC tool paths to remove sections of the NC tool path that were automatically generated. In addition, a part programmer may also attempt to interpolate, or estimate, an NC tool path from NC tool paths that were automatically generated.

Unfortunately, because this "teaching" method is slow, labor intensive and limited to manual levels of precision, the inaccuracy and cost of machining and/or inspecting parts having complex regions is increased tremendously.

SUMMARY OF INVENTION

The above discussed and other drawbacks and deficiencies of the prior art are overcome or alleviated by a method for defining a numerically controlled (NC) tool path on an identified region of a solid computer model. In an exemplary embodiment, the method includes identifying boundary points so as to bound the identified region. The boundary points are processed so as to generate a plurality of bounding curves, wherein the bounding curves are generated so as to conform to a surface of the identified region. The NC tool path is then generated in a manner conforming to the bounding curves.

In another aspect, a method for defining a numerically controlled (NC) tool path on a identified region of a solid computer model includes identifying boundary points so as to bound the identified region. A first external rail is created from a first pair of the boundary points, the first external rail comprising a curve conforming to a surface of the solid computer model. A second external rail is then created from a second pair of the boundary points, the second external rail also comprising a curve conforming to a surface of the solid computer mode. In addition, a plurality of rungs is created from rung connection points defined on the first and said second external rails, wherein the NC tool path is generated in a manner conforming to the conforming curves defined by the first and second external rails and the rungs.

In still another aspect, a system for defining a numerically controlled (NC) tool path on a identified region of a solid computer model includes an input device for selecting boundary points so as to bound the identified region. A processing device is used for processing the boundary points, so as to generate a plurality of bounding curves. The bounding curves are generated so as to conform to a surface of the identified region. In addition, a display device is used for displaying the bounded curves upon the surface of the identified region. The NC tool path is generated in a manner conforming to the bounding curves.

BRIEF DESCRIPTION OF DRAWINGS

Referring to the exemplary drawings wherein like elements are numbered alike in the several Figures.

DETAILED DESCRIPTION

Figure 1:
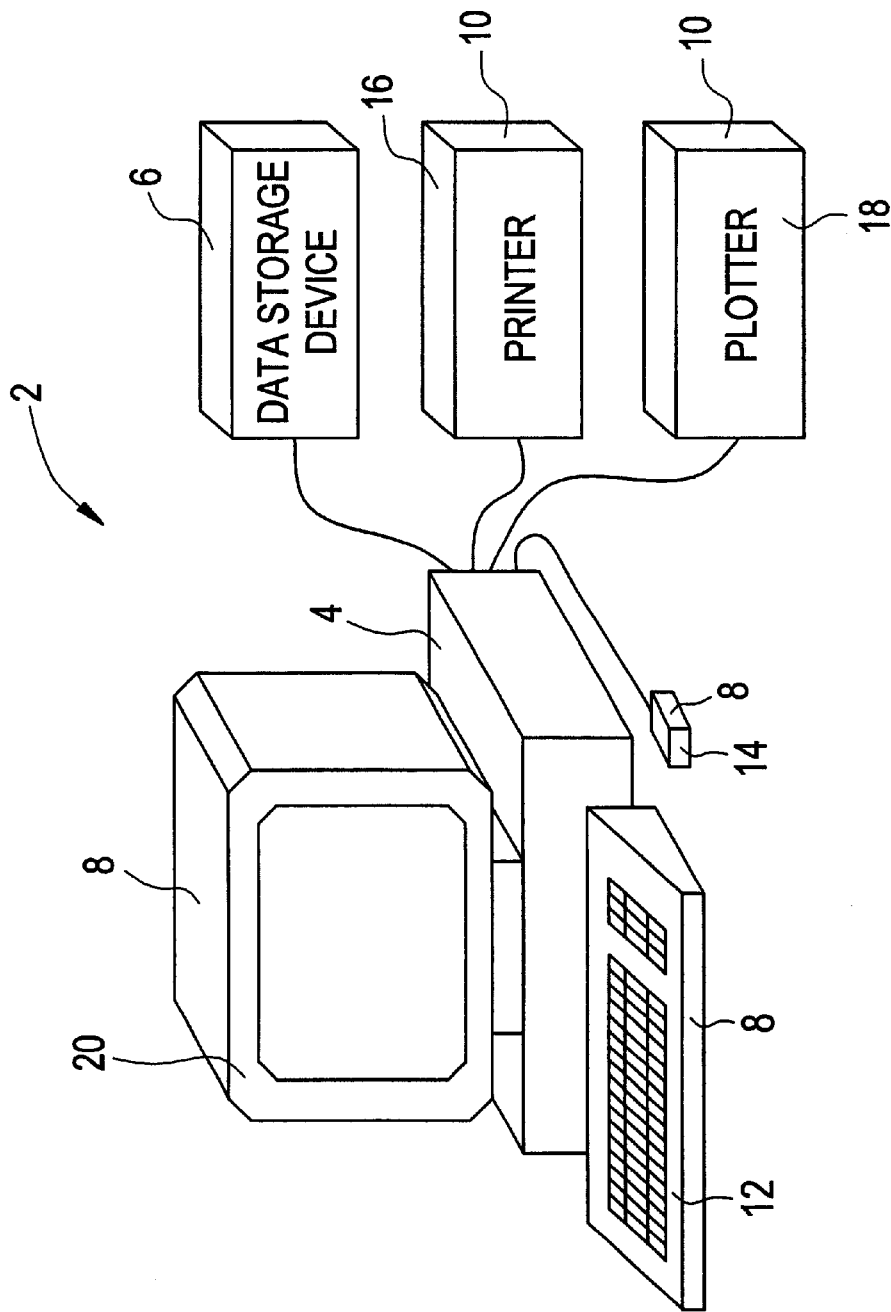
FIG. 1 is a schematic diagram of a computer processing system including an input device and an output device suitable for practicing an embodiment of the present disclosure.

Referring initially to FIG. 1, there is shown a computer processing system 2 suitable for practicing an embodiment of the invention. The computer processing system 2 includes a processing device 4, a data storage device 6, an input device 8 and an output device 10. The input device 8 may be any input device suitable to the desired end purpose such as a light pen, a keyboard 12 and/or a mouse 14. Moreover, output device 10 may be any output device suitable to the desired end purpose, such as a printer 16, a plotter 18, a CRT and/or an LCD display 20.

Figure 2:
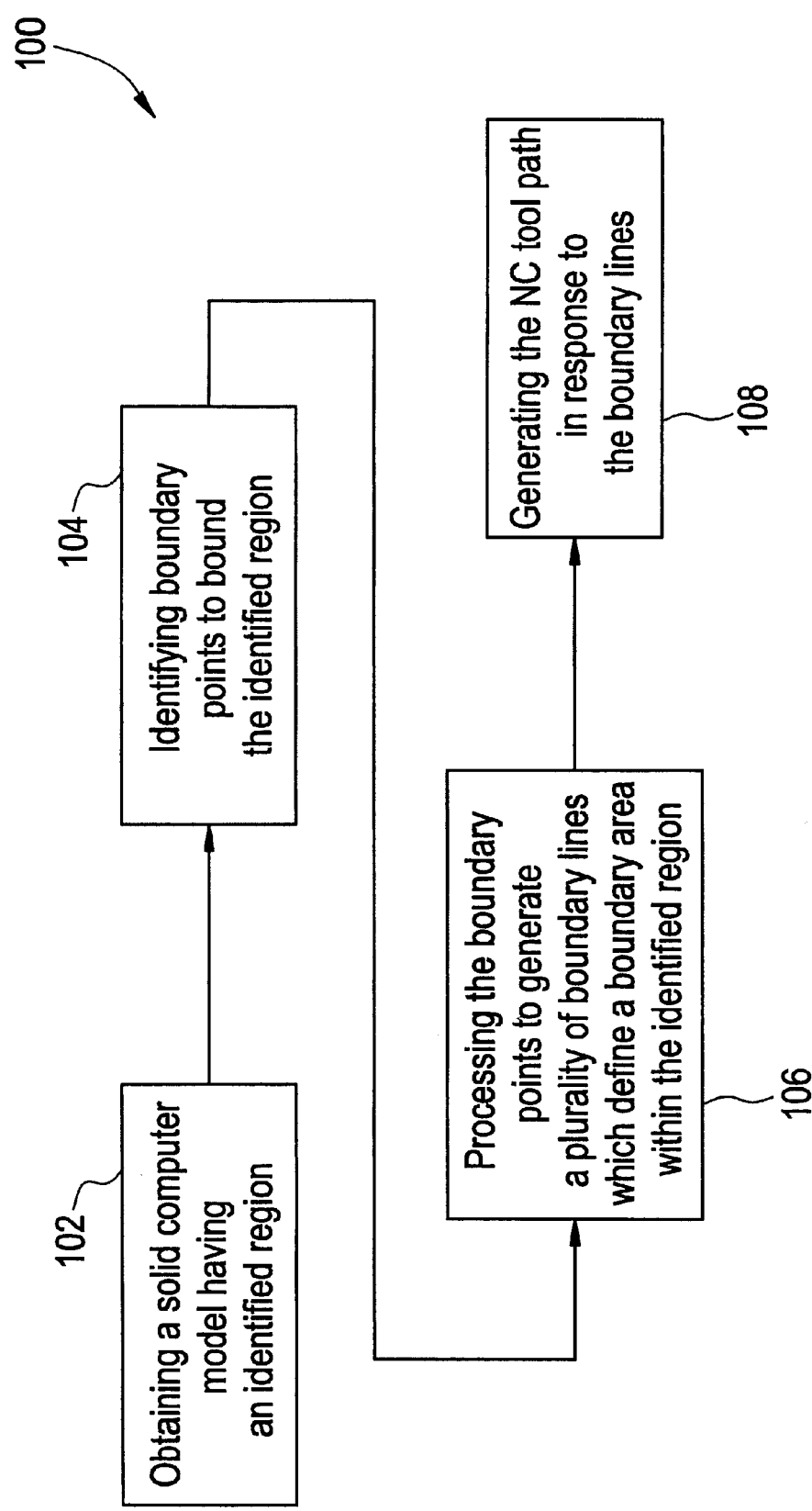
FIG. 2 is a block diagram illustrating a method for generating a numerically controlled (NC) tool path on an arbitrary region of a solid computer model, in accordance with an embodiment of the invention.

FIG. 2 is a block diagram illustrating a method 100 for generating an NC tool path on an arbitrary region of a solid computer model, in accordance with an embodiment of the invention. Beginning at block 102, a surface region of interest on an object represented by a solid computer model is first identified. This identified region is then bounded by a user through appropriate inputs (i.e., boundary points) to the computer model, as shown in block 104. Once formed, the boundary points are then processed, as described in greater detail hereinafter, to create a moveable lattice of rails and rungs defined on the surface of the model, as illustrated in block 106. Once the rails and rungs are adjusted in accordance with the user's input, an NC tool path is created in conformance with the boundary lines defined by the lattice, as shown in block 108.

Figure 3:
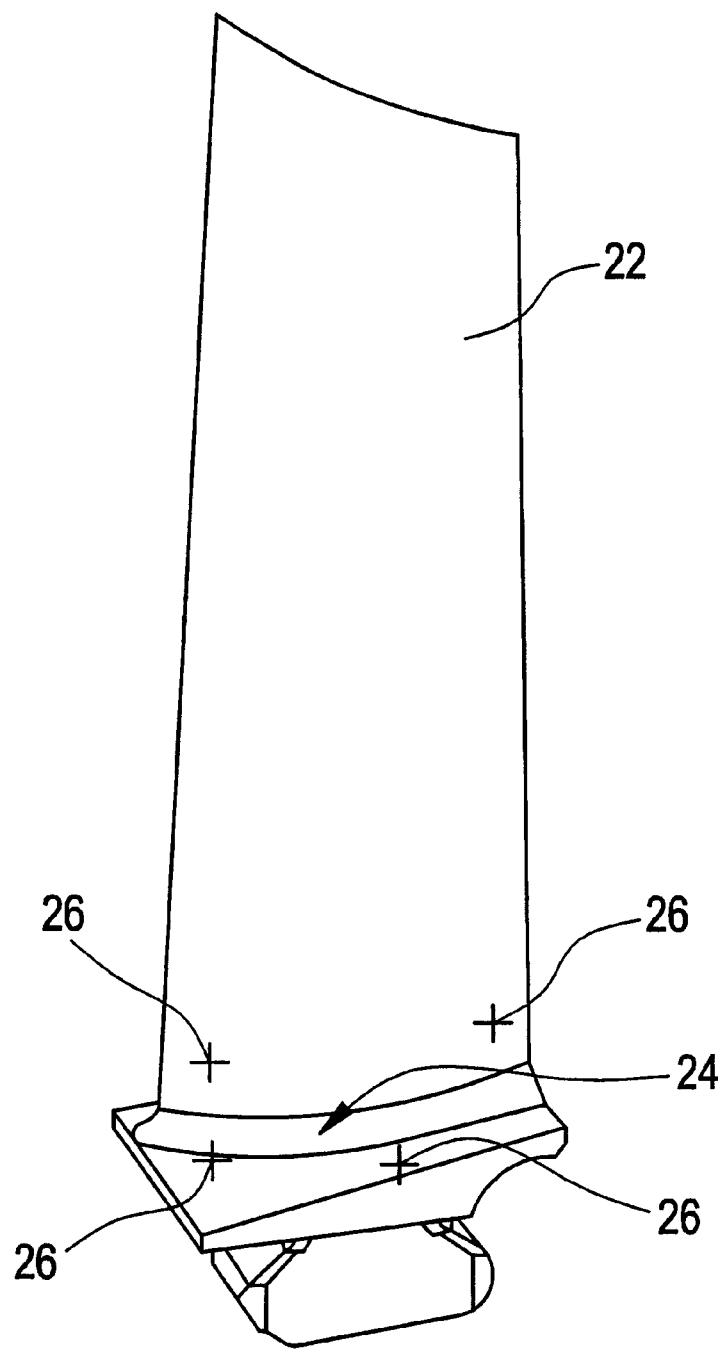
FIG. 3 is a side view of a computer model of an exemplary work piece, particularly illustrating four corners of an NC tool path boundary defined thereupon.

The method 100 may be further understood by way of reference to FIGS. 3–11, in which an example of the generation of the rails and rungs is particularly illustrated. Specifically, FIG. 3 illustrates a solid computer model 22 representing an exemplary object to be processed. The solid computer model 22 may be obtained via any method and/or device suitable to the desired end purpose, such as a result of a design process or from an archive of part models. The model 22 may further be imported from another CAD system through any conventional data exchange protocols. Once the solid computer model 22 is obtained, a user examines it in order to identify a region 24 of interest on the surface thereof, wherein the identified region 24 represents a surface area for which an NC tool path is to be generated. To this end, a plurality of boundary points 26 are then located by the user, in order to bound the identified region 24.

Figure 4:
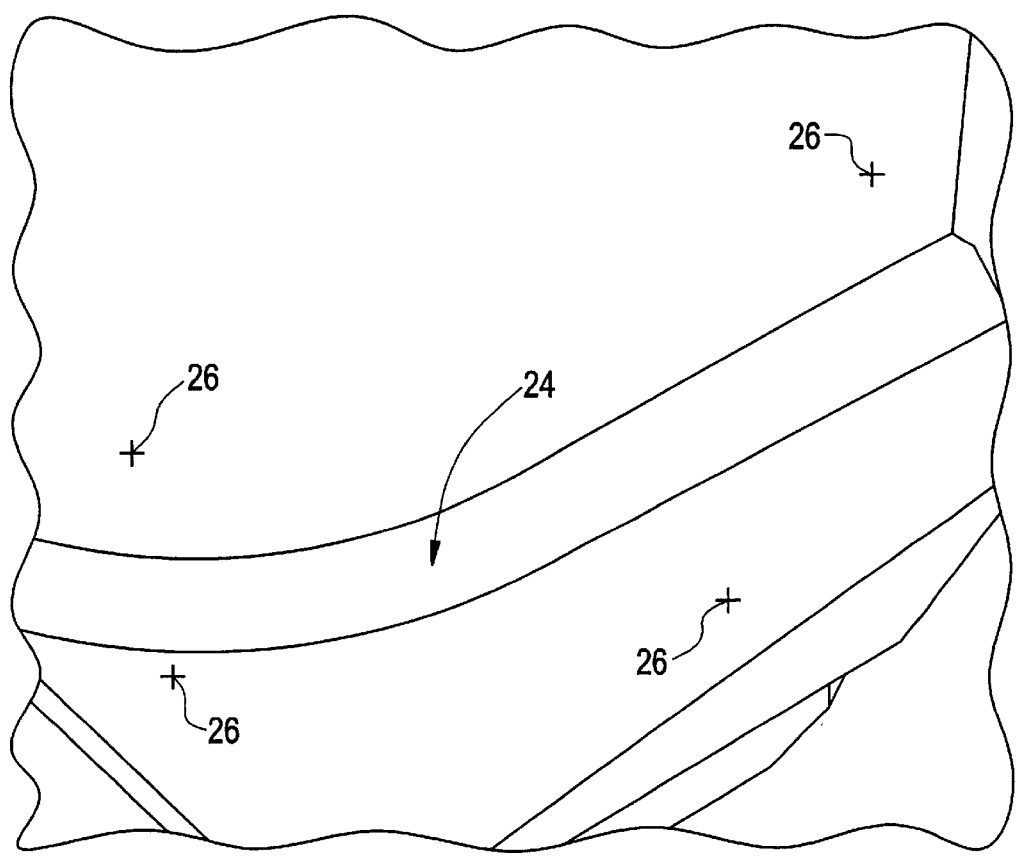
FIG. 4 is a closer view of a the NC tool path boundary area in FIG. 3.

The placement of the boundary points 26, as also shown in the close up view of FIG. 4, may be accomplished using input device 8 (e.g., by entering a series of mouse clicks or through the use of a haptic interface). The inputted location of the boundary points 26 are displayed to the user upon the solid computer model 22 via output device 10 (e.g., a computer screen). Although in the illustrated embodiment there are four boundary points selected, it will be appreciated that a different number of points may be used to define the boundaries of the region of interest.

Figure 5:
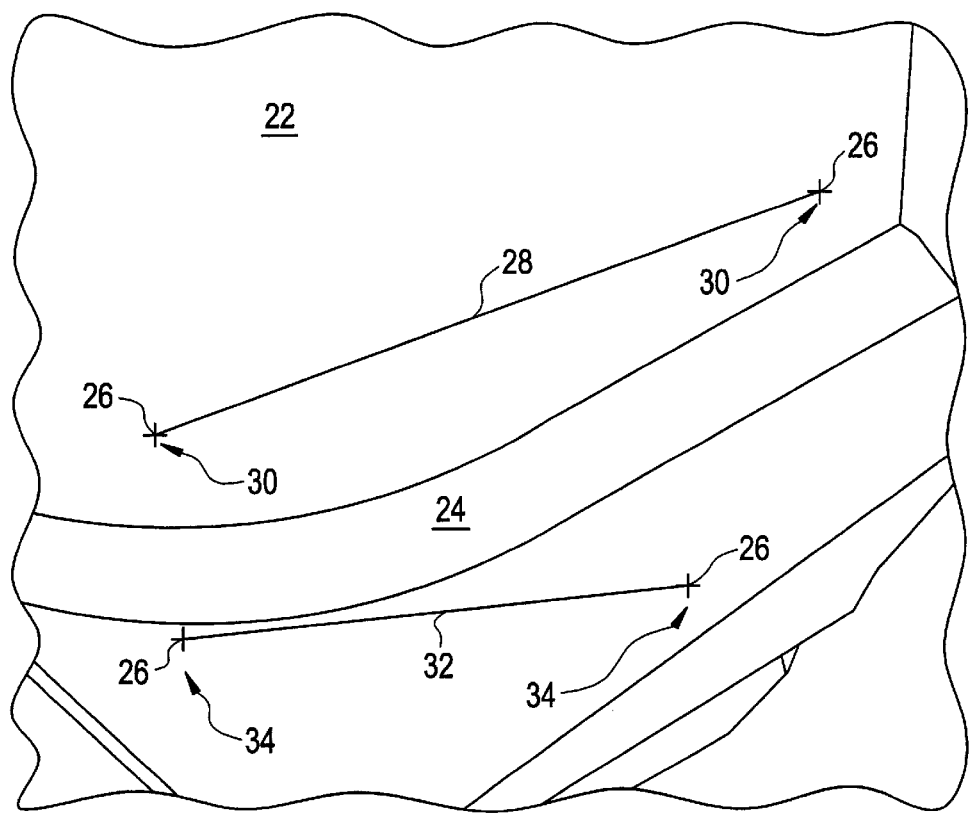
FIG. 5 illustrates the formation of a pair of external rails using the four corners of the NC tool path boundary area.

Once the boundary points 26 are created, a first external rail 28 is created by associating a first pair 30 of boundary points with one another, as shown in FIG. 5. The first external rail 28 is essentially a generated curve connecting the first pair of boundary points, and conforms to the surface of the solid computer model 22 using any of a number of well-known mathematical projection techniques. For example, such techniques may include generating sets of points along the curves, projecting the sets of points down upon the surface, and then re-splining through the points to achieve a new curve that lies close to the intended surface. The points may be projected to the closest corresponding point on the surface, or they may be projected along a viewing direction or other direction specified by the user.

Similarly, a second external rail 32 is created by associating a second pair 34 (i.e., the remaining pair) of boundary points with one another. It will be noted that the first pair 30 of boundary points and the second pair 34 of boundary points are preferably selected such that second external rail 32 runs in the same general direction as the first external rail 28. Moreover, the first pair 30 of boundary points and the second pair 34 of boundary points may be selected such that the first external rail 28 and the second external rail 32 are separated by the surface area of the identified region 24 for which an NC tool path is to be generated.

Figure 6:
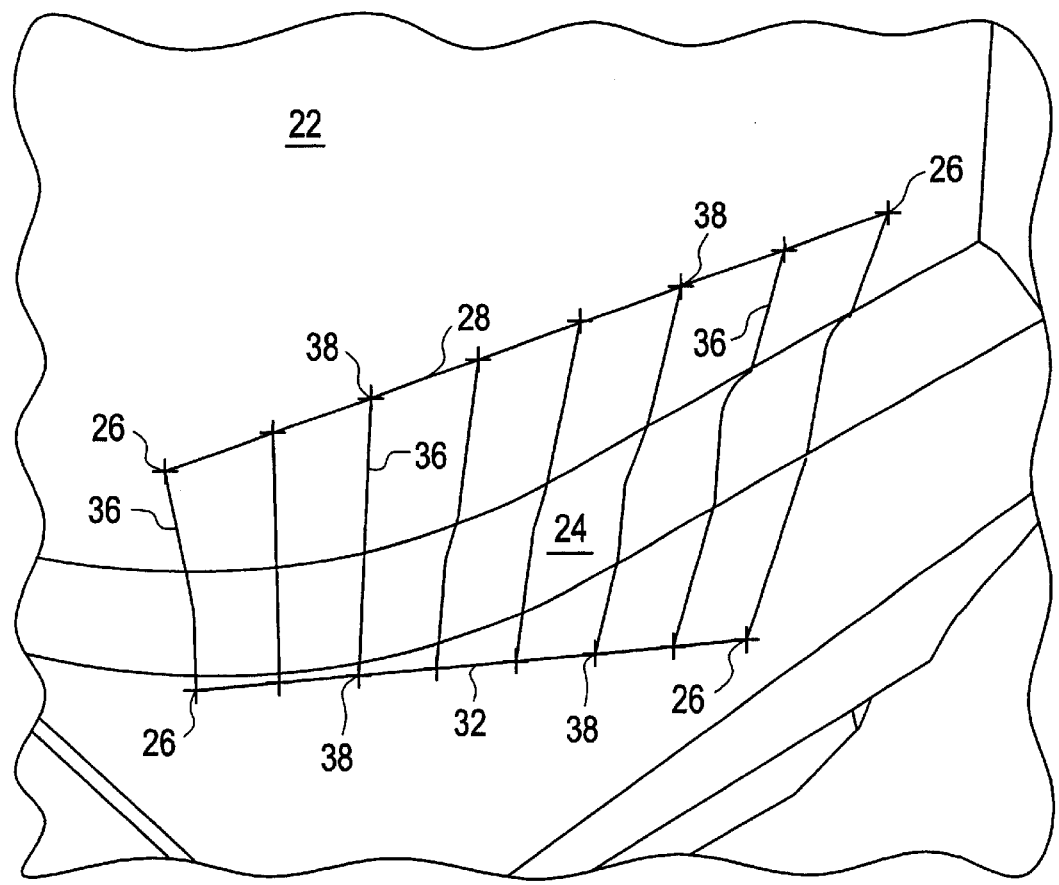
FIG. 6 illustrates the formation of a series of rungs spaced between the external rails, thereby creating additional rung connection points at each intersection between a rung and a rail.

FIG. 6 illustrates the formation of a series of rungs 36 spaced between the first and second external rails 28, 32. The rungs 36 are formed by connecting corresponding, equidistantly spaced rung connection points 38 on the first and second external rails (including the boundary points 26). The number of rungs 36 to be added may be user definable and can be changed during the implementation of method 100. The spacing between each rung depends on the number of rungs selected. As is the case with the external rails, the rungs are also curves that conform to the surface of the solid computer model 22. It will be noted that in addition to the original boundary points 26, the newly created rung connection points 38 are also displayed.

Figure 7:
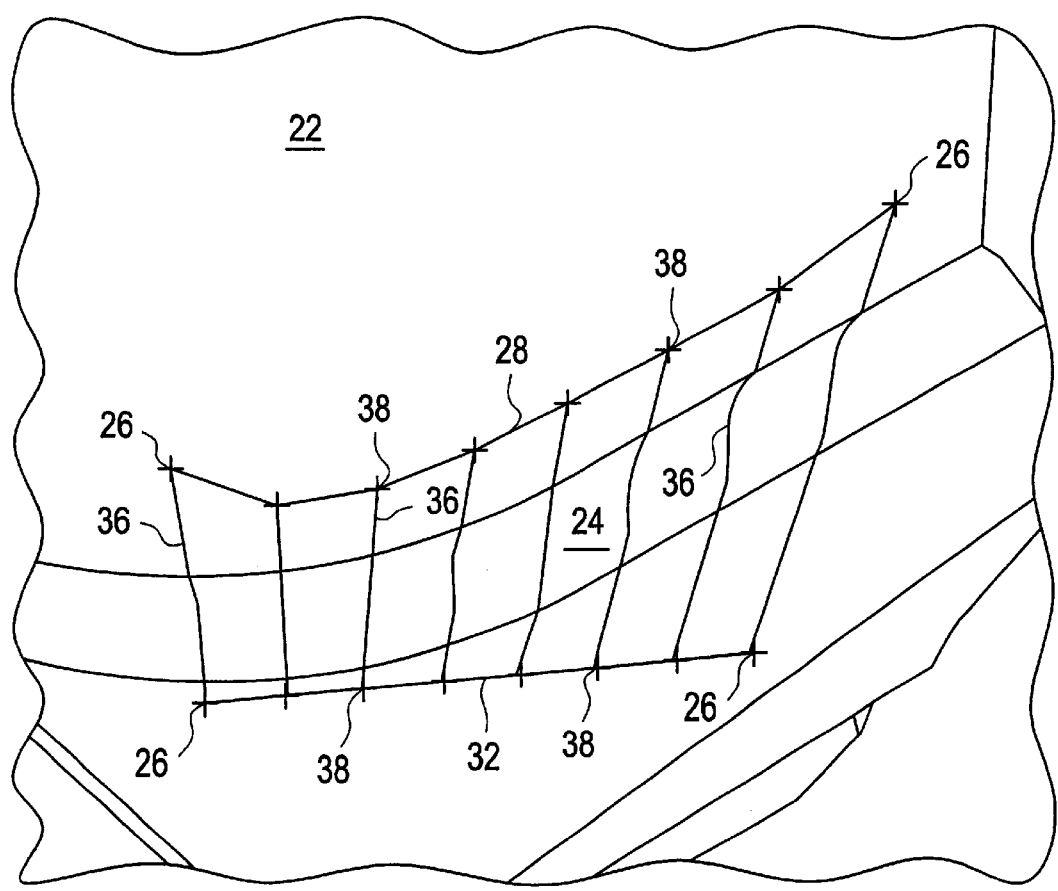
FIG. 7 illustrates the relocation of certain points to adjust the rails so as to more precisely define the NC tool path boundary area.

Once the rungs 36 are created, the user is then free to move any of the boundary points 26 and the rung connection points 38 to a different location on the model 22. An example of this capability is shown in FIG. 7. As can be seen, each of the rung connection points 38 between the boundary points 26 of the first external rail 28 have been moved in a downward direction, toward the second external rail 32. It will also be noted that each rung 36 corresponding to a moved rung connection point 38 has been recalculated and reconfigured to conform to the surface of the model 22.

Figure 8:
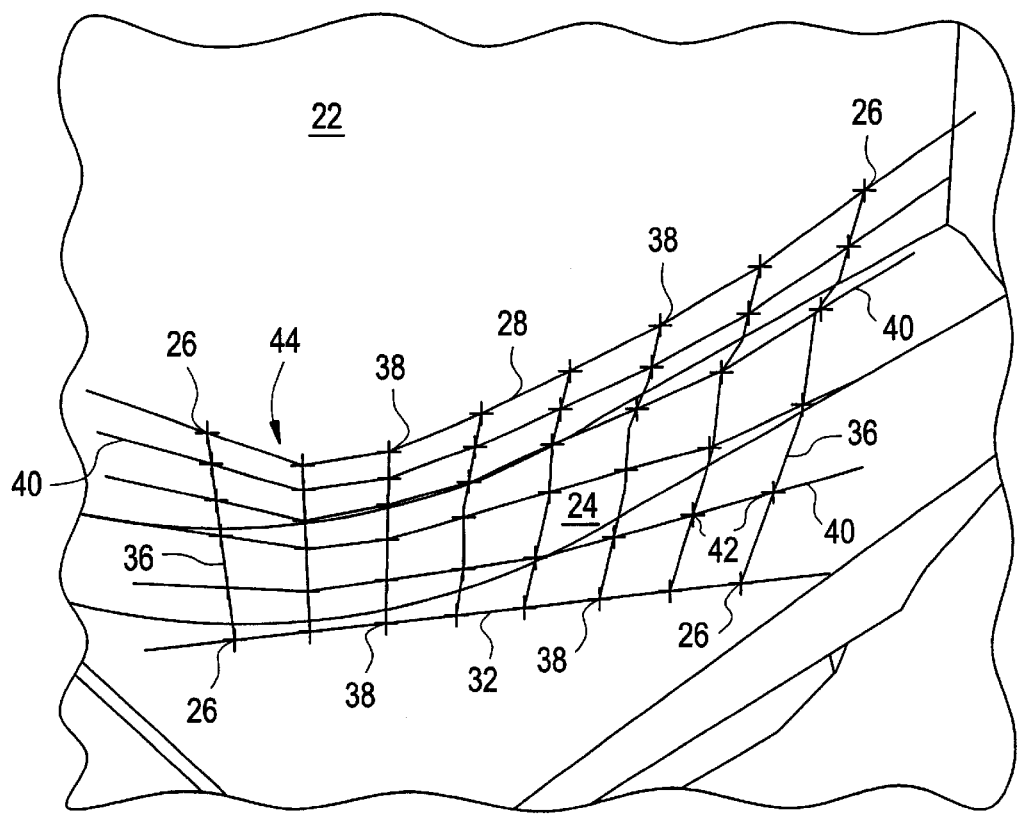
FIG. 8 is illustrates the addition of inner rails between the outer rails and intersecting the rungs, thereby forming a lattice.

In addition to the external rails, the method 100 also provides a user with the capability of forming a series of internal rails 40. In a manner similar to the formation of the rungs 36, a user may be prompted for a desired number of internal rails 40 that are formed by connecting corresponding, equidistantly spaced rail connection points 42 on each of the rungs. Again, like the rungs 36 and the external rails 28, 32, the internal rails 40 are also conformed to the surface of the model 22. The addition of internal rails 40 is illustrated in FIG. 8, in which a surface-conforming lattice 44 of bounding curves (rungs and rails) is now fully formed.

Figure 9:
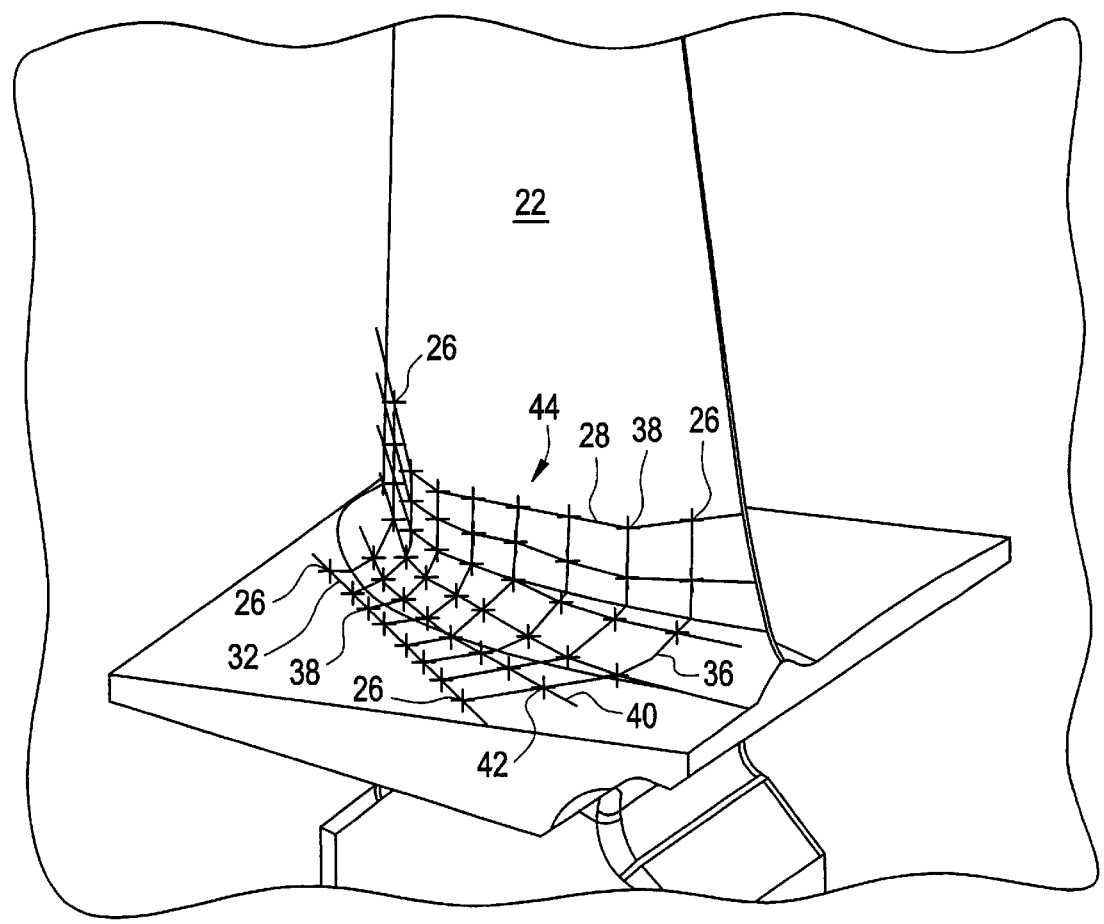
FIG. 9 is a first rotated view of the lattice of NC tool path boundary area in FIG. 8.
Figure 10:
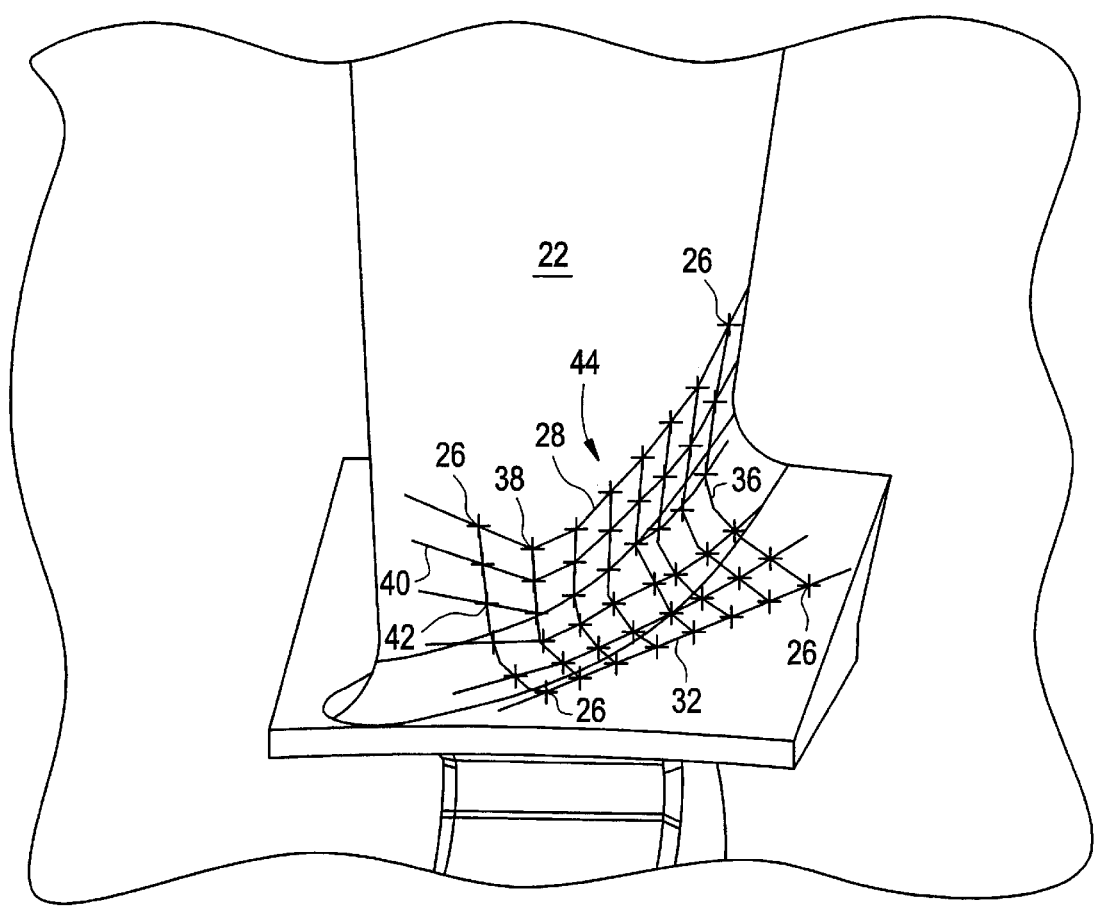
FIG. 10 is a second rotated view of the lattice of NC tool path boundary area in FIG. 8.
Figure 11:
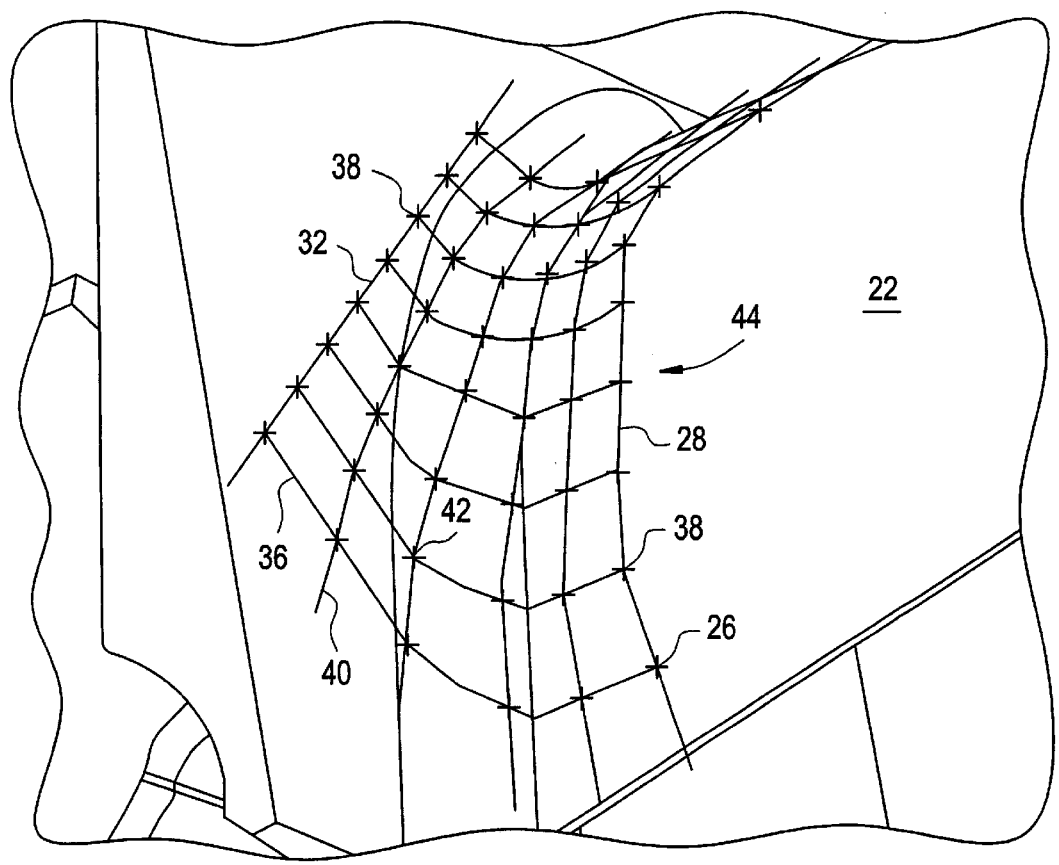
FIG. 11 is a third rotated view of the lattice of NC tool path boundary area in FIG. 8.

Finally, FIGS. 9, 10 and 11 are rotated views of the lattice 44 projected onto the surface of the identified region 24 within which the NC tool path is to be generated. At this point in the application of method 100, any of the boundary points 26 or the rung connection points 38 may be relocated to a different point on the surface of the identified region 24 of the solid computer model 22. Once a particular point has been relocated, the lattice 44 (i.e., the rails and rungs) is recalculated so as to re-conform to the surface of a newly identified region 24.

The resulting set of curves on the surface of the identified region 24 of the solid computer model 22 may then be processed so as to generate an NC tool path via any method and/or device suitable to the desired end purpose. An NC tool path is created by adding points along the rails and rungs at a spacing consistent with the needs of the NC process. Tool axis vectors can then be constructed at each point, which may be identified in any appropriate manner that provides for proper sequencing of the tool path.

As will be appreciated, the above described method allows for the generation of an easily modifiable, user definable boundary within which a tool path may be created. Moreover, because the boundary crosses both geometric faces and features, the surface lattice 44 is not constrained by the particular construction of the solid computer model 22 of the part or by the modeling system. Additionally, once the NC tool path boundary area 24 has been defined, the process of creating the tool path geometry may be automated and thus repeatable. Furthermore, the application of method 100 allows for the quick and easy processing of arbitrary locations on a solid computer model surface 22, without the need for "hand editing" of the resulting geometry. Moreover, if an NC tool path boundary area 24 different from a selected area is desired, the surface lattice 44 may be modified simply by sliding any of the boundary points 26 to different locations on the solid computer model 22.

In order to perform the above mentioned functions and desired processing, as well as the computations therefor (e.g., the execution of Fourier analysis algorithm(s), the control processes prescribed herein, and the like), the controller of FIG. 2 may include, but not be limited to, a processor(s), computer(s), memory, storage, register (s), timing, interrupt(s), communication interfaces, and input/output signal interfaces, as well as combinations comprising at least one of the foregoing. For example, the controller may include signal input signal filtering to enable accurate sampling and conversion or acquisitions of such signals from communications interfaces. It is also considered within the scope of the present invention embodiments that the processing of FIG. 2 may be implemented by a controller located remotely from processing device 4.

In addition, the disclosed invention may be embodied in the form of computer-implemented processes and apparatuses for practicing those processes. The present, invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or as data signal transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for defining a numerically controlled (NC) tool path on a user defined identified region of a solid computer model, the method comprising:
   identifying boundary points, wherein said boundary points are selected so as to bound the identified region in a manner independent of the geometry of the solid computer model; and
   processing said boundary points, so as to generate a plurality of bounding curves, wherein said bounding curves are generated so as to conform to a surface of the identified region;
   wherein the NC tool path is generated in a manner conforming to said bounding curves.

2. The method of claim 1, wherein said boundary points are movably disposed so as to adjustably bound said identified region.

3. The method of claim 1, wherein said processing said plurality of bounding curves includes a plurality of rails, wherein said plurality of rails are disposed so as to run in the same general direction with one another.

4. The method of claim 1, wherein said processing said boundary points further comprises generating a plurality of rungs, wherein said plurality of rungs are disposed so as to run in the same general direction with one another.

5. The method of claim 1, wherein said processing said boundary points further comprises generating a plurality of bounding curves having a plurality of rails and a plurality of rungs, wherein said plurality of rails and said plurality of rungs are disposed relative to each other so as to form a lattice structure.

6. The method of claim 5, wherein said processing said boundary points includes determining a desired quantity of said rails and said rungs.

7. A method for defining a numerically controlled (NC) tool path on a user defined identified region of a solid computer model, the method comprising:
   identifying boundary points, wherein said boundary points are selected so as to bound the identified region;
   creating a first external rail from a first pair of said boundary points, said first external rail comprising a curve conforming to a surface of the solid computer model;
   creating a second external rail from a second pair of said boundary points, said second external rail also comprising a curve conforming to a surface of the solid computer mode; and
   creating a plurality of rungs from user defined rung connection points on said first and said second external rails;
   wherein the NC tool path is generated in a manner conforming to said conforming curves defined by said first and second external rails and said rungs.

8. The method of claim 7, wherein said boundary points and said rung connection points are moveable with respect to the solid computer model.

9. The method of claim 7, further comprising creating a plurality of internal rails from rail connection points defined on said plurality of rungs.

10. The method of claim 9, wherein the number of said plurality of rungs and the number of said plurality of internal rails are user definable.

11. A computer storage medium, comprising:
    a machine readable computer program code for defining a numerically controlled (NC) tool path on a user defined identified region of a solid computer model;
    instructions for causing a computer to implement a method, the method further comprising:
        identifying boundary points, wherein said boundary points are selected so as to bound the identified region in a manner independent of the geometry of the solid computer model; and
        processing said boundary points, so as to generate a plurality of bounding curves, wherein said bounding curves are generated so as to conform to a surface of the identified region;

wherein the NC tool path is generated in a manner conforming to said bounding curves.

12. The medium of claim 11, wherein said boundary points are movably disposed so as to adjustably bound said identified region.

13. The medium of claim 11, wherein said processing said boundary points further comprises generating a plurality of bounding curves including a plurality of rails, wherein said plurality of rails are disposed so as to run in the same general direction with one another.

14. The medium of claim 11, wherein said processing said boundary points further comprises generating a plurality of rungs, wherein said plurality of rungs are disposed so as to run in the same general direction with one another.

15. The medium of claim 11, wherein said processing said boundary points further comprises generating a plurality of bounding curves having a plurality of rails and a plurality of rungs, wherein said plurality of rails and said plurality of rungs are disposed relative to each other so as to form a lattice structure.

16. The medium of claim 15, wherein said processing said boundary points includes determining a desired quantity of said rails and said rungs.

17. A computer storage medium, comprising:
   a machine readable computer program code for defining a numerically controlled (NC) tool path on a user defined identified region of a solid computer model;
   instructions for causing a computer to implement a method, the method further comprising:
      identifying boundary points, wherein said boundary points are selected so as to bound the identified region in a manner independent of the geometry of the solid computer model; and
      processing said boundary points, so as to generate a plurality of bounding curves, wherein said bounding curves are generated so as to conform to a surface of the identified region;
   wherein the NC tool path is generated in a manner conforming to said bounding curves.

18. A system for defining a numerically controlled (NC) tool path on a user defined identified region of a solid computer model, the system comprising:
   an input device for selecting boundary points so as to bound the identified region in a manner independent of the geometry of the solid computer model;
   a processing device for processing said boundary points, so as to generate a plurality of bounding curves, wherein said bounding curves are generated so as to conform to a surface of the identified region; and
   a display device for displaying said bounded curves upon said surface of the identified region;
   wherein the NC tool path is generated in a manner conforming to said bounding curves.

19. The system of claim 18, wherein said boundary points are movably disposed so as to adjustably bound said identified region.

20. The system of claim 18, wherein said processing device generates a plurality of bounding curves including a plurality of rails, wherein said plurality of rails are disposed so as to run in the same general direction with one another.

21. The system of claim 18, wherein said processing device generates a plurality of rungs, wherein said plurality of rungs are disposed so as to run in the same general direction with one another.

22. The system of claim 18, wherein said processing device generates a plurality of bounding curves having a plurality of rails and a plurality of rungs, wherein said plurality of rails and said plurality of rungs are disposed relative to each other so as to form a lattice structure.

\* \* \* \* \*